(12) United States Patent
Kim

(10) Patent No.: US 11,855,044 B2
(45) Date of Patent: Dec. 26, 2023

(54) SEMICONDUCTOR PACKAGE UTILIZING A HYBRID BONDING PROCESS AND METHOD OF MANUFACTURING THE SAME

(71) Applicant: SAMSUNG ELECTRONICS CO., LTD., Suwon-si (KR)

(72) Inventor: Jihoon Kim, Cheonan-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 181 days.

(21) Appl. No.: 17/367,005

(22) Filed: Jul. 2, 2021

(65) Prior Publication Data
US 2022/0157779 A1    May 19, 2022

(30) Foreign Application Priority Data

Nov. 13, 2020    (KR) .................. 10-2020-0151642

(51) Int. Cl.
H01L 25/065 (2023.01)
H01L 23/48 (2006.01)
H01L 23/31 (2006.01)

(52) U.S. Cl.
CPC ...... *H01L 25/0657* (2013.01); *H01L 23/3107* (2013.01); *H01L 23/481* (2013.01); *H01L 2225/06517* (2013.01)

(58) Field of Classification Search
CPC ........... H01L 24/94; H01L 2224/06181; H01L 25/0652; H01L 25/0657; H01L 23/481; H01L 23/5386; H01L 23/13; H01L 23/31
See application file for complete search history.

(56) References Cited

U.S. PATENT DOCUMENTS

| 8,102,060 | B2 | 1/2012 | Plossl et al. |
| 9,142,532 | B2 | 9/2015 | Suga et al. |
| 9,502,391 | B2* | 11/2016 | Kwon ................. H01L 23/5389 |
| 10,186,500 | B2* | 1/2019 | Ryu ....................... H01L 24/19 |
| 2005/0062166 | A1* | 3/2005 | Kang ................. H01L 29/0657 |
| | | | 257/E29.022 |

(Continued)

FOREIGN PATENT DOCUMENTS

| JP | 6395600 | 9/2018 |
| JP | 20180170368 | 11/2018 |
| KR | 10-2020-0048771 | 5/2008 |

*Primary Examiner* — Mamadou L Diallo
(74) *Attorney, Agent, or Firm* — F. CHAU & ASSOCIATES, LLC

(57) ABSTRACT

A semiconductor package includes a first semiconductor chip and a second semiconductor chip. The first semiconductor chip includes a peripheral region having a groove and a bonding region that is disposed higher than the groove. The second semiconductor chip is disposed in the bonding region of the first semiconductor chip. The second semiconductor chip is directly electrically connected to the first semiconductor chip. The second semiconductor chip includes an overhang protruded from the bonding region. The overhang is spaced apart from a bottom surface of the groove. Thus, a bonding failure, which may be caused by particles generated during a cutting the wafer and adhered to the edge portion of the second semiconductor chip, between the first semiconductor chip and the second semiconductor chip might be avoided.

20 Claims, 12 Drawing Sheets

(56) References Cited

U.S. PATENT DOCUMENTS

| | | | |
|---|---|---|---|
| 2015/0155266 A1* | 6/2015 | Kim | H01L 24/06 |
| | | | 257/737 |
| 2016/0005714 A1* | 1/2016 | Lee | H01L 23/367 |
| | | | 257/777 |
| 2017/0186728 A1* | 6/2017 | Chainer | H01L 23/473 |
| 2017/0358558 A1* | 12/2017 | Lee | H01L 23/481 |
| 2018/0033779 A1* | 2/2018 | Park | H01L 23/13 |
| 2018/0211937 A1* | 7/2018 | Lee | H01L 25/0657 |
| 2019/0139938 A1* | 5/2019 | Andry | H01L 25/0657 |
| 2019/0206844 A1* | 7/2019 | Lee | H01L 25/50 |
| 2019/0385995 A1* | 12/2019 | Metras | H01L 23/481 |
| 2020/0111763 A1* | 4/2020 | Hong | H01L 24/08 |
| 2020/0135698 A1 | 4/2020 | Hong et al. | |
| 2020/0176437 A1 | 6/2020 | Wimplinger | |
| 2020/0411472 A1* | 12/2020 | Chung | H01L 25/105 |

\* cited by examiner

SEMICONDUCTOR PACKAGE UTILIZING A HYBRID BONDING PROCESS AND METHOD OF MANUFACTURING THE SAME

CROSS-RELATED APPLICATION

This application claims priority under 35 USC § 119 to Korean Patent Application No. 10-2020-0151642, filed on Nov. 13, 2020 in the Korean Intellectual Property Office (KIPO), the contents of which are herein incorporated by reference in their entirety.

TECHNICAL FIELD

The present disclosure relates to a semiconductor package and a method of manufacturing the same. More particularly, the present disclosure relates to a semiconductor package including a first semiconductor chip and a second semiconductor chip bonded to the first semiconductor chip by a hybrid bonding process, and a method of manufacturing the semiconductor package.

DISCUSSION OF THE RELATED ART

Recently, a second semiconductor chip may be electrically connected, directly, to a first semiconductor chip by a hybrid bonding process. Thus, the generation of a joint gap between the first semiconductor chip and the second semiconductor chip can be avoided.

According to related arts, during the cutting of a wafer including a plurality of the second semiconductor chips, a high concentration of particles may be generated at an edge portion of the second semiconductor chip.

When the second semiconductor chip is be bonded to the first semiconductor chip by the hybrid bonding process, the edge portion of the second semiconductor chip might not make proper contact with the first semiconductor chip due to the presence of the particles. Thus, the second semiconductor chip might not be properly electrically connected to the first semiconductor chip and so a bonding failure may be generated.

SUMMARY

A semiconductor package includes a first semiconductor chip, a second semiconductor chip and a molding member. The first semiconductor chip includes a plurality of connection vias and a wiring connected to lower ends of the connection vias. The second semiconductor chip is disposed on a central portion of an upper surface of the first semiconductor chip. The second semiconductor chip includes bonding pads directly contacting upper ends of the connection vias. The molding member is formed on the upper surface of the first semiconductor chip and at least partially surrounds the second semiconductor chip. The connection vias are disposed on the central portion of the upper surface of the first semiconductor chip. The central portion of the upper surface of the first semiconductor chip is positioned on a plane that is higher than a plane on which an edge portion of the upper surface of the first semiconductor chip is positioned, relative to a package substrate. An edge portion of the second semiconductor chip includes an overhang horizontally protruded from the central portion of the upper surface of the first semiconductor chip. The overhang is spaced apart from the edge portion of the upper surface of the first semiconductor chip. The overhang has a horizontal length of about 3/20 times to about 9/20 times a width of the second semiconductor chip. A distance between a lower surface of the overhang and the edge portion of the upper surface of the first semiconductor chip is no less than about 8 μm.

A semiconductor package includes a first semiconductor chip and a second semiconductor chip. The first semiconductor chip includes a peripheral region having a groove and a bonding region positioned higher than the groove, relative to a package substrate. The second semiconductor chip is disposed in the bonding region of the first semiconductor chip. The second semiconductor chip is directly electrically connected to the first semiconductor chip. The second semiconductor chip includes an overhang protruded from the bonding region. The overhang is spaced apart from a bottom surface of the groove.

A method of manufacturing a semiconductor package utilizes a wafer that includes a plurality of first semiconductor chips. The wafer has a plurality of bonding regions and peripheral region surrounding each of the bonding regions. A groove is formed at an upper surface in the peripheral regions to upwardly protrude the bonding regions more than the peripheral regions. A plurality of second semiconductor chips, each of which has a size larger than a size of the bonding region, are hybrid-bonded to the bonding regions to form an overhang at an edge portion of each of the second semiconductor chip. The overhang is spaced apart from a bottom surface of the groove. The wafer is then cut along the peripheral regions.

A semiconductor package includes a first semiconductor chip, a second semiconductor chip, a lower redistribution layer (RDL) structure, and a molding member. The first semiconductor chip includes a peripheral region having a groove and a bonding region positioned higher than the groove relative to a package substrate. The second semiconductor chip is disposed in the bonding region of the first semiconductor chip. The second semiconductor chip is directly electrically connected to the first semiconductor chip. The second semiconductor chip includes an overhang protruded from the bonding region. The overhang is spaced apart from a bottom surface of the groove. The lower RDL structure is disposed under the first semiconductor chip. The lower RDL structure is electrically connected to the first semiconductor chip. The molding member is formed on an upper surface of the lower RDL structure and at least partially surrounds the first semiconductor chip and the second semiconductor chip.

A semiconductor package includes a package substrate, a logic chip, at least one first semiconductor chip and at least two stacked second semiconductor chips. The logic chip is disposed on an upper surface of the package substrate. The logic chip includes a first bonding region, a second bonding region, and a peripheral region at least partially surrounding each of the first and second bonding regions. The first semiconductor chip is disposed in the first bonding region of the logic chip. The first semiconductor chip is directly electrically connected to the logic chip. The second semiconductor chips are stacked in the second bonding region of the logic chip. The second semiconductor chips are directly electrically connected to the logic chip. The peripheral region of the logic chip has a groove. The peripheral region is positioned lower than the first and second bonding regions, relative to a package substrate. The first semiconductor chip includes a first overhang protruded from the first bonding region. The first overhang is spaced apart from a bottom surface of the groove. At least one of the second semiconductor chips includes a second overhang protruded from the second bonding region. The second overhang is spaced apart from a bottom surface of the groove.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Hereinafter, example embodiments of the present disclosure will be explained in detail with reference to the accompanying drawings.

Figure 1:
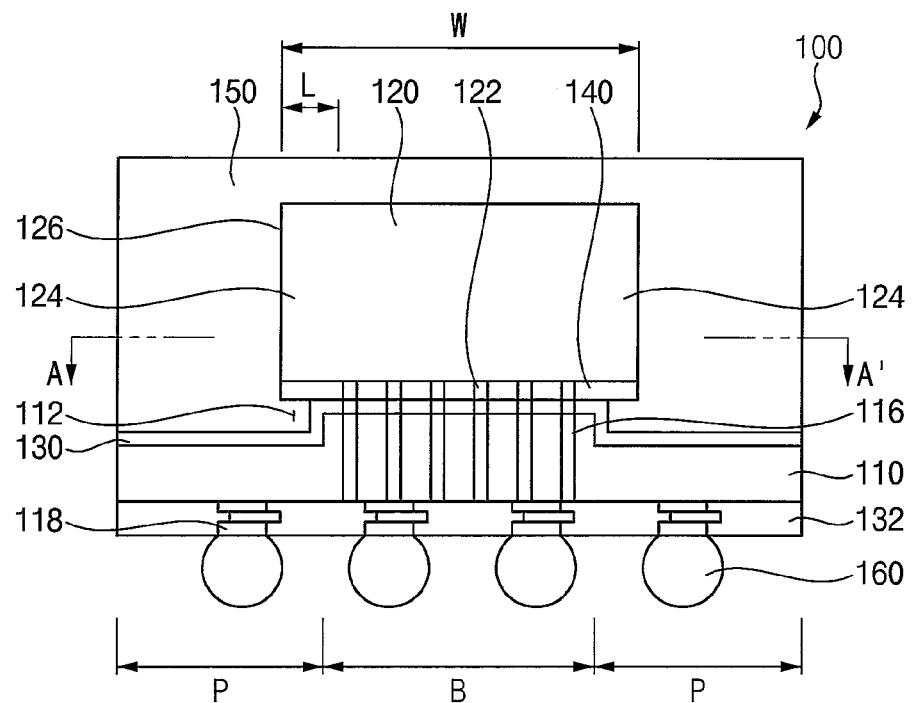
FIG. 1 is a cross-sectional view illustrating a semiconductor package in accordance with example embodiments of the present disclosure.
Figure 2:
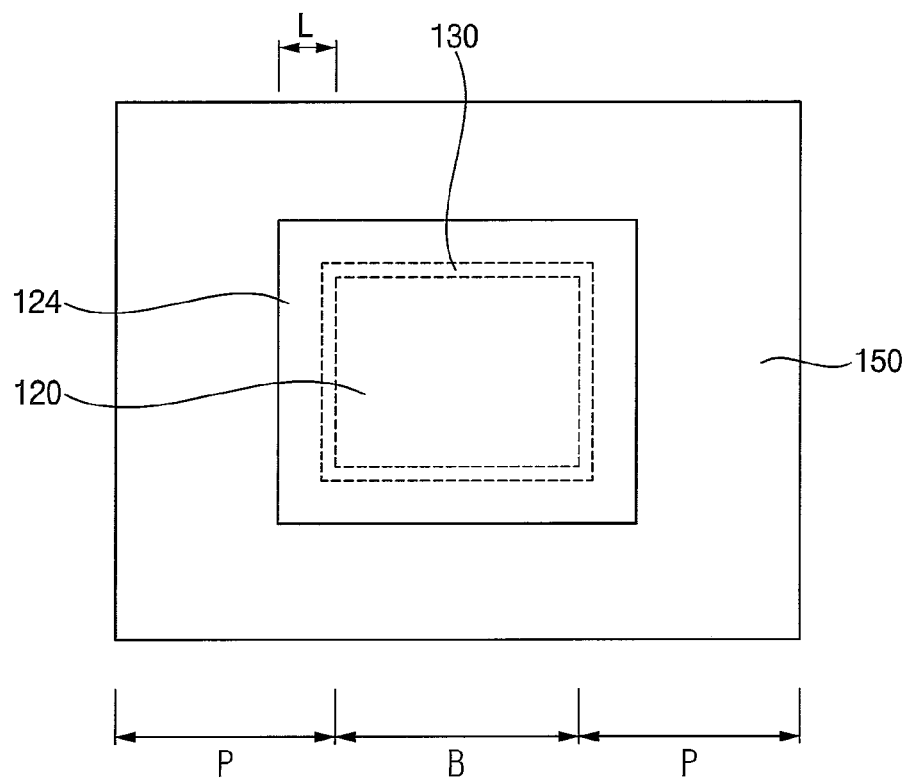
FIG. 2 is a cross-sectional view taken along a line A-A in FIG. 1.

FIG. 1 is a cross-sectional view illustrating a semiconductor package in accordance with example embodiments of the present disclosure, and FIG. 2 is a cross-sectional view taken along a line A-A' in FIG. 1.

Referring to FIGS. 1 and 2, a semiconductor package 100 may include a first semiconductor chip 110, a second semiconductor chip 120, a molding member 150 and conductive bumps 160.

The first semiconductor chip 110 may include a plurality of connection vias 116. The connection vias 116 may be vertically disposed in the first semiconductor chip 110. Each of the connection vias 116 may include an upper end exposed through an upper surface of the first semiconductor chip 110, and a lower end exposed through a lower surface of the first semiconductor chip 110. The connection vias 116 may include through silicon vias (TSV).

An upper insulation layer 130 may be formed on the upper surface of the first semiconductor chip 110. The upper insulation layer 130 may have openings exposing the connection vias 116. Further, a lower insulation layer 132 may be formed on the lower surface of the first semiconductor chip 110. The upper insulation layer 130 and the lower insulation layer 132 may include an insulation material such as oxide, but the present disclosure is not necessarily limited to this arrangement. The lower insulation layer 132 may be considered a package substrate.

A wiring 118 may be disposed in the lower insulation layer 132. The wiring 118 may include an upper end exposed through an upper surface of the lower insulation layer 132, and a lower end exposed through a lower surface of the lower insulation layer 132. The upper end of the wiring 118 may be electrically connected to the lower end of the connection via 116. The wiring 118 may have a steplike stack structure, but the present disclosure is not necessarily limited to this arrangement.

The first semiconductor chip 110 may be divided into a bonding region B and a peripheral region P. The second semiconductor chip 120 may be disposed over the first semiconductor chip 110. For example, the second semiconductor chip 120 may be disposed in the boning region B to be electrically connected to the first semiconductor chip 120. In contrast, the peripheral region P might not be electrically connected to the second semiconductor chip 120. Thus, the upper ends of the connection vias 116 may be disposed on an upper surface of the bonding region B.

In example embodiments of the present disclosure, the bonding region B may have a rectangular shape positioned at a central portion of the upper surface of the first semiconductor chip 110. The peripheral region P may correspond to an edge portion of the upper surface of the first semiconductor chip 110 configured to surround the bonding region B. Thus, the peripheral region P may have a rectangular frame shape.

The bonding region B may be upwardly protruded from the peripheral region P. For example, the upper surface of the bonding region B may be higher than an upper surface of the peripheral region P, with respect to a level of the package substrate, which may be considered to be the lower insulation layer 132. The protruded structure of the bonding region B may be obtained by forming a groove 112 at the peripheral region P. For example, when the groove 112 may be formed along the peripheral region P, the upper surface of the peripheral region B may become lower than the upper surface of the bonding region B to provide the bonding region B with the upwardly protruded structure than the peripheral region P.

In example embodiments of the present disclosure, the groove 112 may have a depth D of no less than about 8 μm, but the present disclosure is not necessarily limited to this arrangement. The depth D of the groove 112 is described in further detail below.

In example embodiments of the present disclosure, the groove 112 may be wholly formed along the peripheral region P. Thus, the groove 112 may have a width that is substantially the same as a width of the peripheral region P. As a result, the whole upper surface of the peripheral region P may be positioned on a plane lower than a plane on which the upper surface of the bonding region B may be positioned. Further, the upper insulation layer 130 may be formed along the upper surfaces of the bonding region B and the peripheral region P. For example, the upper insulation layer 130 may be formed along an inner surface of the groove 112.

The second semiconductor chip 120 may include a plurality of bonding pads 122. The bonding pads 122 may be disposed on a lower surface of the second semiconductor chip 120. Thus, the lower surface of the second semiconductor chip 120 may correspond to an active face of the second semiconductor chip 120. The second semiconductor chip 120 may have a rectangular shape corresponding to the rectangular bonding region B.

The bonding pads 122 of the second semiconductor chip 120 may be directly connected to the connection vias 116 of the first semiconductor chip 110. For example, the bonding pads 122 may directly contact the connection vias 116. For example, the bonding pads 122 may be directly connected to the connection vias 116 by a hybrid bonding process. Thus, the lower surface of the second semiconductor chip 120 may contact the upper surface of the first semiconductor chip 110. As a result, a joint gap might not be formed between the lower surface of the second semiconductor chip 120 and the upper surface of the first semiconductor chip 110.

When particles are present on the lower surface of the second semiconductor chip 120 in the hybrid bonding process for directly contacting the lower surface of the second semiconductor chip 120 with the upper surface of the first semiconductor chip 110, a void may be generated between the first semiconductor chip 110 and the second semiconductor chip 120. The void may bring about an electrical connection error between the bonding pad 122 and the connection via 116. For example, the particles may be generated in cutting a wafer including the second semiconductor chips 120 along a scribe lane. The particles may adhere to an edge portion of the second semiconductor chip 120 in a high concentration.

To prevent the electrical connection error between the second semiconductor chip 120 and the first semiconductor chip 110 due to the particles, the second semiconductor chip 120 may have an area larger than an area of the bonding region B of the first semiconductor chip 110. Thus, when the second semiconductor chip 120 may be disposed on the upper surface of the bonding region B of the first semiconductor chip 110, the edge portion of the second semiconductor chip 120 may be horizontally protruded from the bonding region B. For example, an overhang 124 protruded from the bonding region B may be formed at the edge portion of the second semiconductor chip 120. Because the second semiconductor chip 120 may have the rectangular shape, the overhang 124 may be formed at four side surfaces of the second semiconductor chip 120.

The overhang 124 may be positioned over the groove 112 at the peripheral region P of the first semiconductor chip 110. Thus, the overhang 124 might not contact the upper surface of the peripheral region P. As a result, the overhang 124 may have a lower surface that is spaced apart from a bottom surface of the groove 112 to form a gap between the lower surface of the overhang 124 and the bottom surface of the groove 112.

As mentioned above, the particles generated in cutting the wafer may be adhered to the edge portion of the second semiconductor chip 120 in a high concentration. Thus, the particles may also be adhered to the lower surface of the overhang 124 corresponding to the edge portion of the second semiconductor chip 120 in a high concentration. However, the lower surface of the overhang 124 with the particles might not contact the upper surface of the first semiconductor chip 110, for example, the bottom surface of the peripheral region P. As a result, the bonding pads 122 of the second semiconductor chip 120 may effectively contact the connection vias 116 in the bonding region B. For example, the particles on the overhang 124 may have no influence on the electrical connection between the bonding pads 122 of the second semiconductor chip 120 and the connection vias 116 in the bonding region B.

In example embodiments of the present disclosure, when the second semiconductor chip 120 may have a width W of about 200 μm, the overhang 124 may have a horizontal length L of about 30 μm to about 90 μm. For example, the horizontal length L of the overhang 124 protruded from the bonding region B may be about 30 μm to about 90 μm. Here, the edge portion of the second semiconductor chip 120 may be partially damaged during the cutting process of the wafer. The damage may be mainly generated within a region having a length of about 30 μm measured from an outer side surface of the second semiconductor chip. The bonding pads 122 might not be disposed in the edge portion of the second semiconductor chip 120 with the damage. Thus, the horizontal length L of the overhang 124, which might not be electrically connected to the first semiconductor chip 110, may be no less than about 30 μm. However, when the damage may be mainly generated within a region having a length of below 30 μm measured from an outer side surface of the second semiconductor chip, the horizontal length L of the overhang 124 may also be below 30 μm.

Further, when the horizontal length L of the overhang 124 may be above about 90 μm, the bonding region B of the second semiconductor chip 120 may have a small area. Thus, the maximum horizontal length L of the overhang 124 may be restricted to about 90 μm. As a result, the horizontal length L of the overhang 124 may be about 3/20 times to about 9/20 times the width W of the second semiconductor chip 120.

Further, to prevent the particles generated in cutting the wafer from being adhered to the lower surface of the overhang 124, the depth D of the groove 112 may be no less than about 8 μm. Thus, a distance between the lower surface of the overhang 124 and the bottom surface of the groove 112 corresponding to the depth D of the groove 112 may also be no less than about 8 μm. A maximum height of the scattered particles generated in cutting the wafer may be below about 8 μm. Thus, setting the distance between the bottom surface of the groove 112 and the lower surface of the overhang 124 may be no less than about 8 μm to decrease the concentration of particles on the lower surface of the overhang 124.

The molding member 150 may be formed on the upper surface of the first semiconductor chip 110 to surround the second semiconductor chip 120. Because the second semiconductor chip 120 may contact the bonding region B of the first semiconductor chip 110, only the upper surface of the peripheral region P, for example, only the bottom surface of the groove 112 may be exposed. Thus, the molding member 150 may be formed on the upper surface of the peripheral region P. For example, the molding member 150 may be formed in a space between the overhang 124 and the groove 112. Alternatively, the molding member 150 might not be formed on the upper surface of the second semiconductor chip 120. In this case, a heat spreader may be disposed on the exposed upper surface of the second semiconductor chip 120. The molding member 150 may include an epoxy molding compound (EMC).

The conductive bumps 160 may be mounted on the lower surface of the first semiconductor chip 110, for example, the lower insulation layer 132. The conductive bumps may be electrically connected to the lower ends of the connection vias 116. The conductive bumps 160 may include solder bumps.

Figure 3:
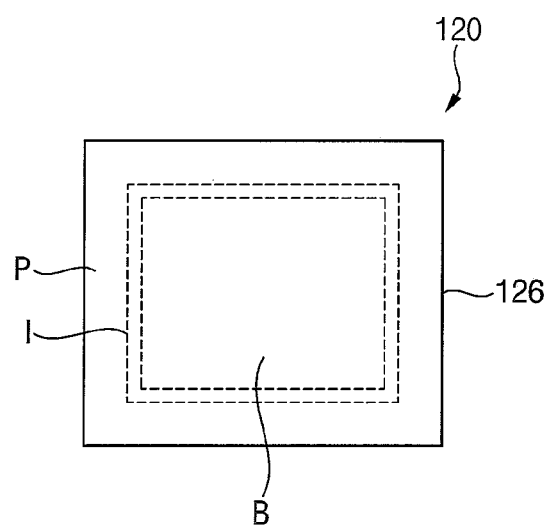
FIG. 3 is a plan view illustrating a method of manufacturing the semiconductor package in FIG. 1.

FIG. 3 is a plan view and FIGS. 4 to 8 are cross-sectional views illustrating a method of manufacturing the semiconductor package in FIG. 1.

Referring to FIG. 3, the wafer may be cut along the scribe lane to separate the second semiconductor chips 120.

Each of the second semiconductor chips 120 in the wafer may also be divided into a bonding region B and a peripheral region P similarly to the first semiconductor chip 110. The bonding region B may be a central portion of the second semiconductor chip 120. The peripheral region P may be an edge portion of the second semiconductor chip 120 configured to surround the bonding region B.

Conventionally, a cut line of the wafer may correspond to a side surface of the bonding region B. Thus, a conventional second semiconductor chip may have a size only including the bonding region B without the peripheral region P. For example, the conventional second semiconductor chip may have an area substantially the same as an area of the bonding region B of the first semiconductor chip 110. Thus, the particles generated in the cutting process may be adhered to an edge portion of the conventional second semiconductor chip that only includes the bonding region B.

In contrast, according to example embodiments of the present disclosure, a cut line of the wafer may be moved from the side surface of the bonding region B to an outside of the second semiconductor chip 120. Thus, the second semiconductor chip 120 separated from the wafer may include the bonding region B and the peripheral region P configured to surround the bonding region B. As a result, the second semiconductor chip 120 may have an area larger than an area of the bonding region B of the first semiconductor chip 110.

The particles generated in cutting the wafer may be mainly adhered to the peripheral region P, e.g., a region between the side surface of the second semiconductor chip 120 and a dotted line I in FIG. 3. In the second semiconductor chip 120 of FIG. 1, the region between the side surface of the second semiconductor chip 120 and the dotted line I may correspond to the overhang 124.

Figure 4:
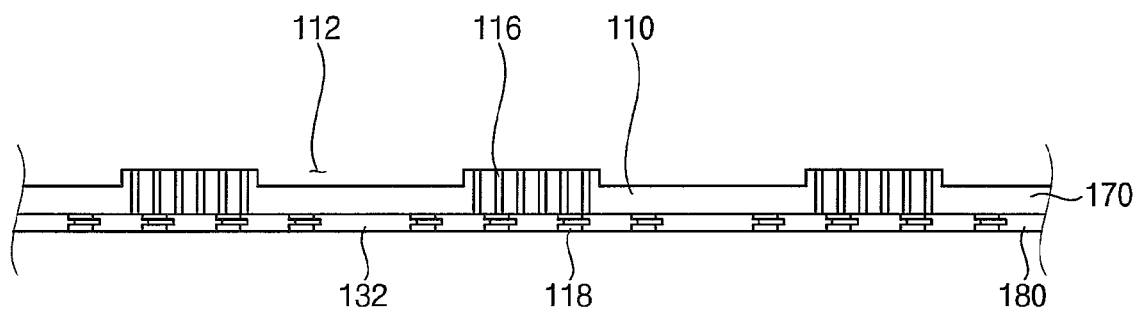
FIGS. 4 to 8 are cross-sectional views illustrating a method of manufacturing the semiconductor package in FIG. 1.

Referring to FIG. 4, the plurality of the first semiconductor chips 110 may be formed in a wafer 170. Each of the first semiconductor chips 110 may include the connection vias 116, a lower insulation layer 132 and the wiring 118.

The groove 112 may be formed at the upper surface of the wafer 170. For example, the groove 112 may be formed at the upper surface of each of the peripheral regions P among the upper surfaces of the first semiconductor chips 110. The depth D of the groove 112 may no less than about 8 μm.

In example embodiments of the present disclosure, the groove 112 may be formed along the whole peripheral region P. Thus, the groove 112 may have a width that is substantially the same as the width of the peripheral region P. The groove 112 may be formed by a laser cutting process, a half cutting process, etc. The groove 112 may have various shapes, and the present invention is not necessarily restricted to using grooves having a specific shape.

Figure 5:
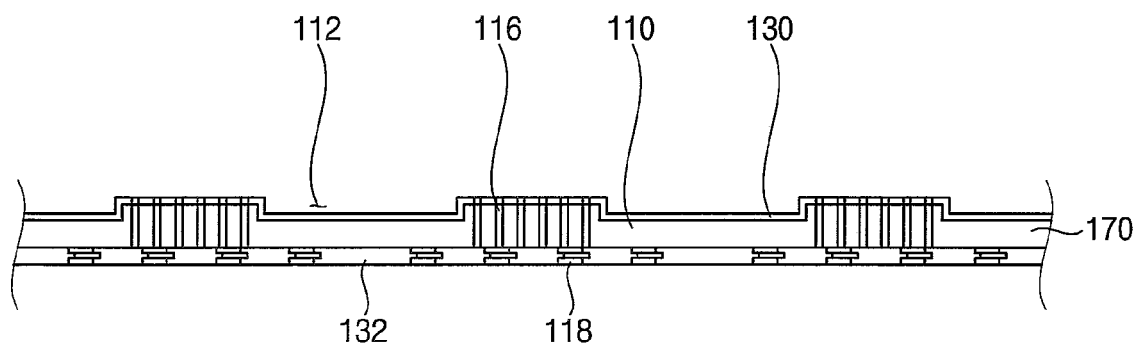

Referring to FIG. 5, the upper insulation layer 130 may be formed on the upper surface of the first semiconductor chip 110. For example, the upper insulation layer 130 may be formed on the upper surfaces of the peripheral region P and the bonding region B. Because the groove 112 may be formed in the peripheral region P, the upper insulation layer 130 may be formed along the inner surface of the groove 112. The upper insulation layer 130 may be formed by a chemical vapor deposition (CVD) process, but the present invention is not necessarily limited thereto.

The upper insulation layer 130 may be planarized to provide the upper insulation layer 130 with a uniform thickness. The upper insulation layer 130 may be planarized by a chemical mechanical polishing (CMP) process, but the present invention is not necessarily limited thereto.

Figure 6:
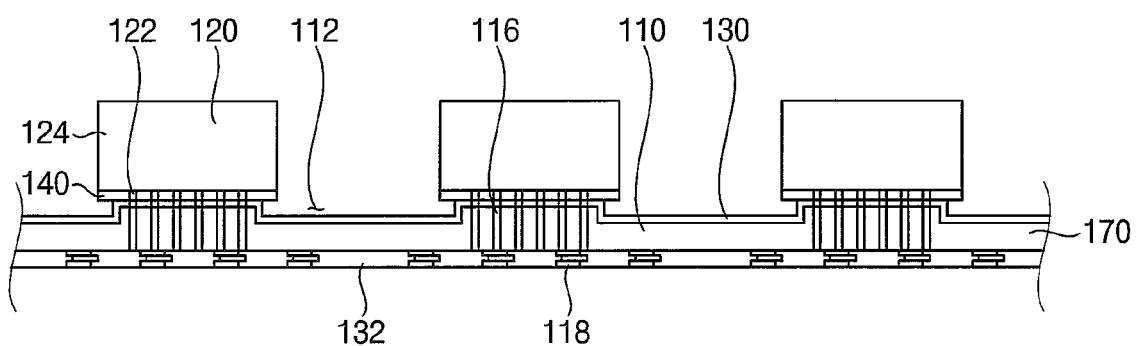

Referring to FIG. 6, the second semiconductor chip 120 may be bonded to the bonding region B of the first semiconductor chip 110 by the hybrid bonding process. Thus, the bonding pads 122 of the second semiconductor chip 120 may be directly bonded to the connection vias in the bonding region B of the first semiconductor chip 110.

The hybrid bonding process may include a dangling process and an annealing process. In the dangling process, the lower surface of the second semiconductor chip 120 may contact the upper surface of the bonding region B in the first semiconductor chip 110 to generate a dangling bonding between silicon in the second semiconductor chip 120 and silicon in the first semiconductor chip 110. In the annealing process, a heat may be applied to the second semiconductor chip 120 and the first semiconductor chip 110 to generate a covalent bonding between the bonding pad 122 and the connection via 116 by expanding the bonding pad 122 and the connection via 116.

As used herein, the generation of a dangling bonding between two objects is understood to be a bonding process in which dangling bonds are present. A dangling bond is an unsatisfied valence on an immobilized atom. An atom with a dangling bond is also referred to as an immobilized free radical or an immobilized radical, a reference to its structural and chemical similarity to a free radical. Some allotropes of silicon, such as amorphous silicon, display a high concentration of dangling bonds. In modern semiconductor device operation, hydrogen, oxygen or other such elements may be introduced to the silicon during the synthesis process to replace dangling bonds.

After performing the hybrid bonding process on the second semiconductor chip 120 and the first semiconductor chip 110, the overhang 124 of the second semiconductor chip 120 may be horizontally protruded from the bonding region B of the first semiconductor chip 110. Further, the overhang 124 may be spaced apart from the peripheral region P by the groove 112. Thus, the particles on the overhang 124 may have no influence on the electrical connection between the bonding pads 122 of the second semiconductor chip 120 and the connection vias 116 of the first semiconductor chip 110.

Figure 7:
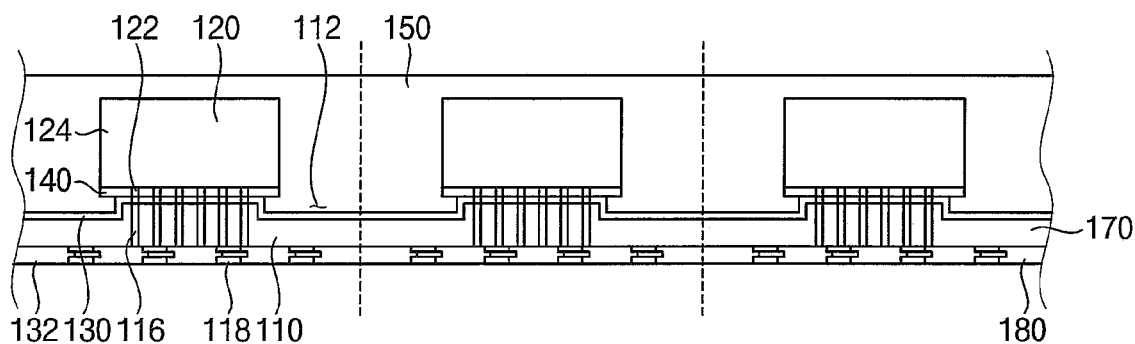

Referring to FIG. 7, the molding member 150 may be formed on the peripheral region P of the first semiconductor chip 110 to surround the second semiconductor chips 120 with the molding member 150.

Figure 8:
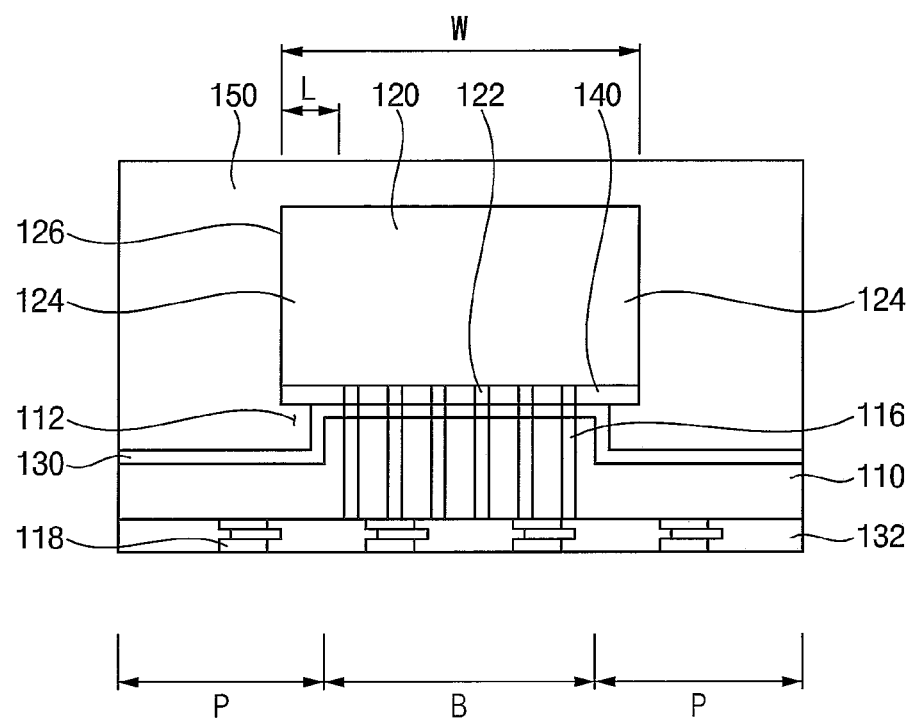

Referring to FIG. 8, the first semiconductor chip 110 and the molding member 150 may then be cut along the cut line set in the peripheral regions P. Alternatively, after cutting the first semiconductor chip 110, the molding member 150 may then be formed.

The conductive bumps 160 may be mounted on the lower surface of the first semiconductor chip 110 to complete the semiconductor package 100 in FIG. 1.

Figure 9:
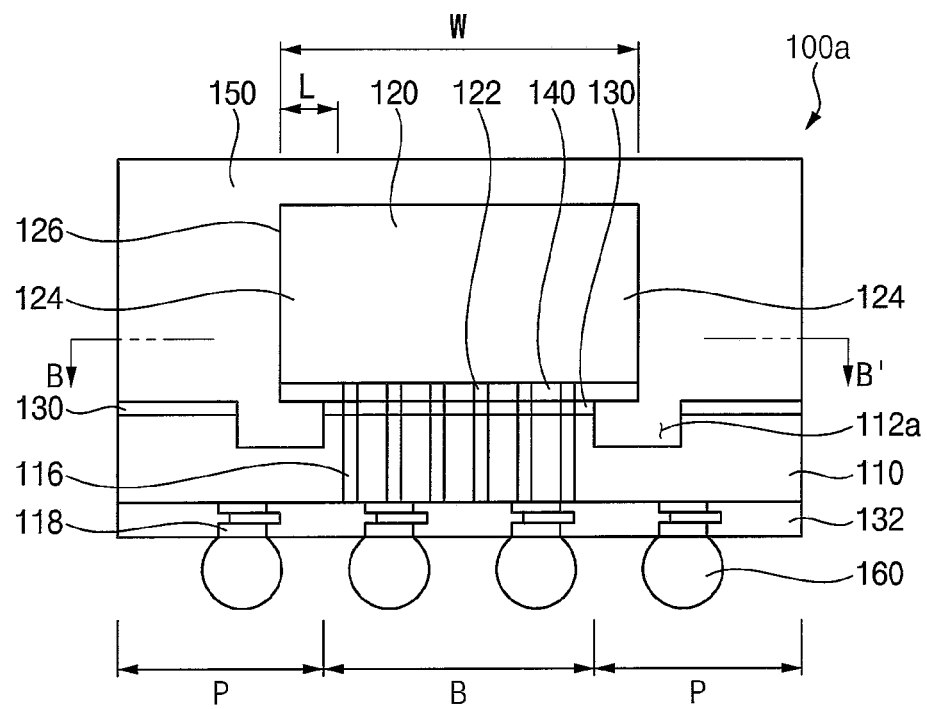
FIG. 9 is a cross-sectional view illustrating a semiconductor package in accordance with example embodiments of the present disclosure.
Figure 10:
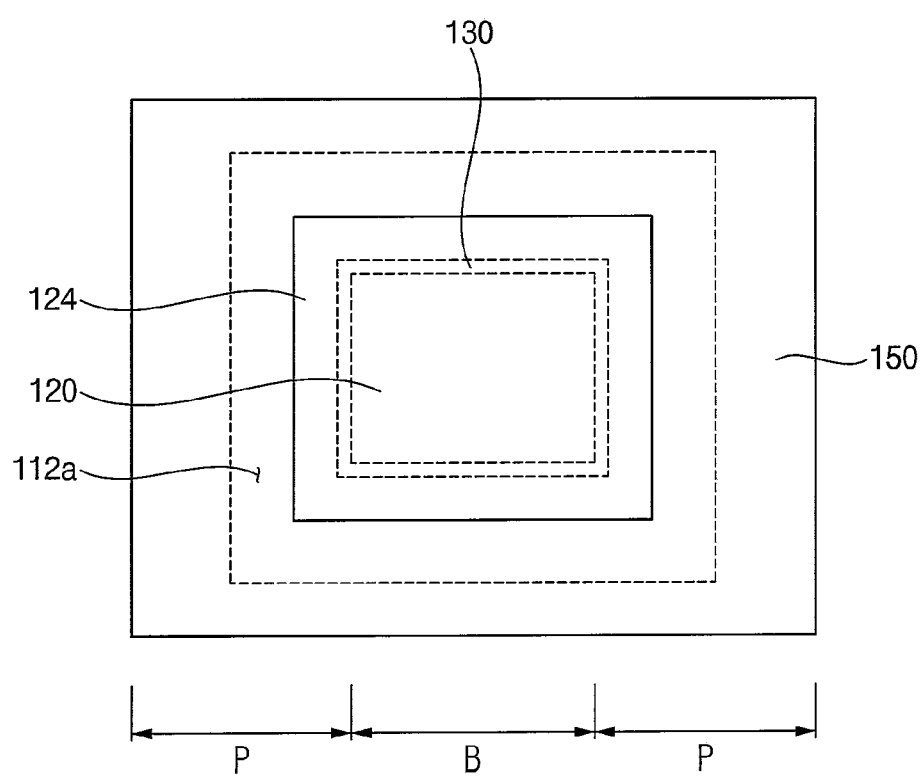
FIG. 10 is a cross-sectional view taken along a line B-B' in FIG. 9.

FIG. 9 is a cross-sectional view illustrating a semiconductor package in accordance with example embodiments of the present disclosure, and FIG. 10 is a cross-sectional view taken along a line B-B' in FIG. 9;

A semiconductor package 100a of this example embodiment may include elements substantially the same as those of the semiconductor package 100 in FIG. 1 except for a groove. Thus, the same reference numerals may refer to the same elements and to the extent that detailed description of certain elements has been omitted, it may be assumed that those elements are at least similar to corresponding elements that have been described elsewhere in the present disclosure.

Referring to FIGS. 9 and 10, a groove 112a may be formed at a part of the peripheral region P of the first semiconductor chip 110. Thus, the groove 112a may have a bottom surface lower than the upper surface of the bonding region B of the first semiconductor chip 110. In contrast, the upper surface of the peripheral region P at which the groove 112a might not be formed may be substantially coplanar with the upper surface of the bonding region B. Thus, the groove 112a may have a width narrower than the width of the peripheral region P. For example, the groove 112a may have an inner surface corresponding to the outer side surface of the bonding region B. Therefore, the groove 112a may have a shape configured to horizontally extend from the outer side surface of the bonding region B.

The groove 112a may be formed by partially removing the upper insulation layer 130 and the semiconductor chip 110 in the peripheral region P. Thus, the upper insulation layer 130 might not be present on the bottom surface of the groove 112a. For example, the upper insulation layer 130 may be disposed on the upper surface of the bonding region B and a portion of the upper surface of the peripheral region P at which the groove 112a might not be formed.

Alternatively, the groove 112a may be formed by wholly removing the upper insulation layer 130 and by partially removing the semiconductor chip 110 in the peripheral region P. In this case, the groove 112a may have a width that is substantially the same as the width of the peripheral region P. However, the upper insulation layer 130 might not be present on the bottom surface of the groove 112a.

The overhang 124 of the second semiconductor chip 120 may be positioned over the groove 112a. Thus, the overhang 124 may have a lower surface that is spaced apart from the upper surface of the peripheral region P, e.g., the bottom surface of the groove 112a. As a result, as mentioned above, the bonding failure between the second semiconductor chip 120 and the first semiconductor chip 110 caused by the particles on the overhang 124 might not be generated.

FIGS. 11 to 15 are cross-sectional views illustrating a method of manufacturing the semiconductor package in FIG. 9.

Figure 11:
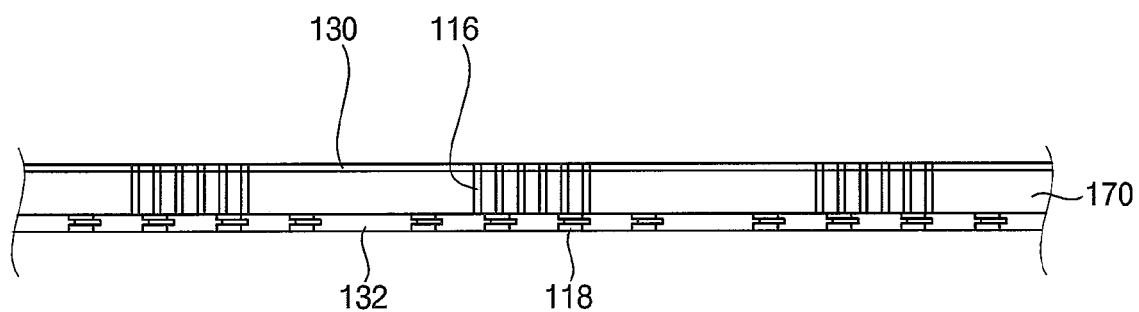
FIGS. 11 to 15 are cross-sectional views illustrating a method of manufacturing the semiconductor package in FIG. 9.

Referring to FIG. 11, the plurality of the first semiconductor chips 110 may be formed in the wafer 170. Each of the first semiconductor chips 110 may include the connection vias 116, a lower insulation layer 132 and the wiring 118.

The upper insulation layer 130 may be formed on the upper surface of the wafer 170. The upper insulation layer 130 may be formed by a chemical vapor deposition (CVD) process, but the present invention is not necessarily limited thereto.

The upper insulation layer 130 may be planarized to provide the upper insulation layer 130 with a uniform thickness. The upper insulation layer 130 may be planarized by a chemical mechanical polishing (CMP) process, but the present invention is not necessarily limited thereto.

Figure 12:
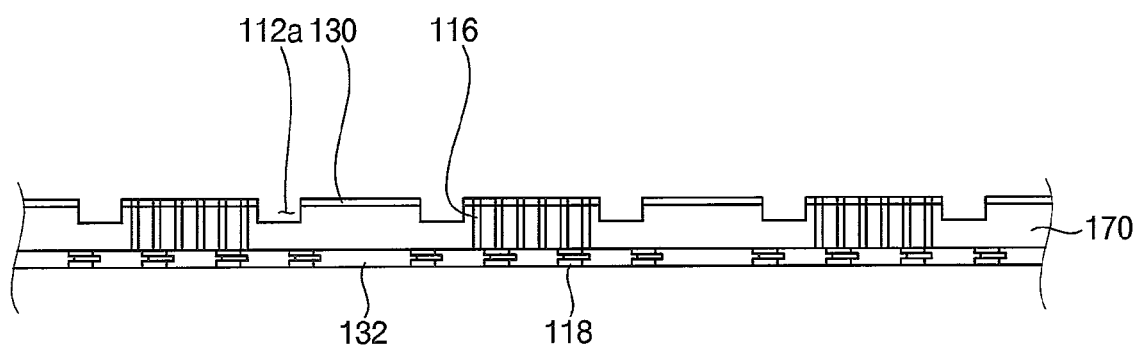

Referring to FIG. 12, the groove 112a may be formed at the upper surface of the wafer 170. For example, the groove 112a may be formed at the upper surface of each of the peripheral regions P among the upper surfaces of the first semiconductor chips 110. For example, the upper insulation layer 130 and the first semiconductor chip 110 in the peripheral region P may be removed to form the groove 112a. Thus, the upper insulation layer 130 might not be present on the inner surface of the groove 112a. For example, the width of the groove 112a may be narrower than the width of the peripheral region P. The inner surface of the groove 112a may correspond to the outer side surface of the bonding region B. As a result, the groove 112a may have a shape horizontally extended from the outer side surface of the bonding region B.

Alternatively, the groove 112a may be formed by wholly removing the upper insulation layer 130 and by partially removing the semiconductor chip 110 in the peripheral region P. In this case, the groove 112a may have a width that is substantially the same as the width of the peripheral region P. However, the upper insulation layer 130 might not be present on the bottom surface of the groove 112a.

Figure 13:
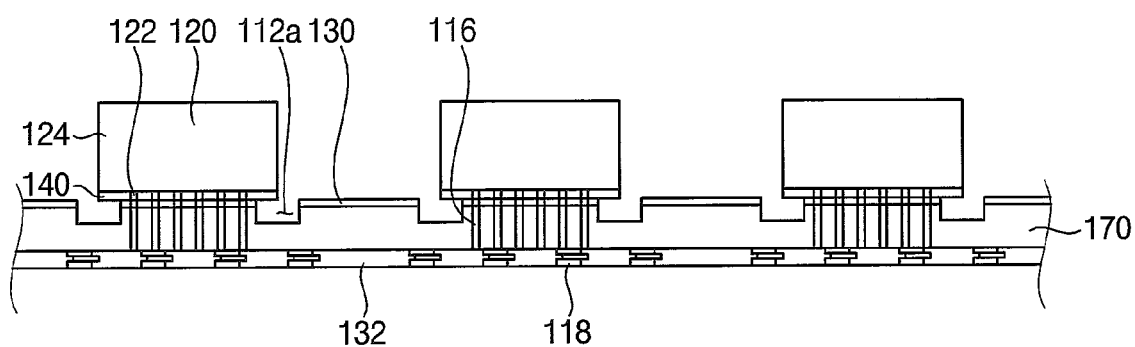

Referring to FIG. 13, the second semiconductor chip 120 may be bonded to the bonding region B of the first semiconductor chip 110 by the hybrid bonding process. Thus, the bonding pads 122 of the second semiconductor chip 120 may be directly bonded to the connection vias in the bonding region B of the first semiconductor chip 110.

After performing the hybrid bonding process on the second semiconductor chip 120 and the first semiconductor chip 110, the overhang 124 of the second semiconductor chip 120 may be horizontally protruded from the bonding region B of the first semiconductor chip 110. Further, the overhang 124 may be spaced apart from the peripheral region P by the groove 112a. Thus, the particles on the overhang 124 may have no influence on the electrical connection between the bonding pads 122 of the second semiconductor chip 120 and the connection vias 116 of the first semiconductor chip 110.

Figure 14:
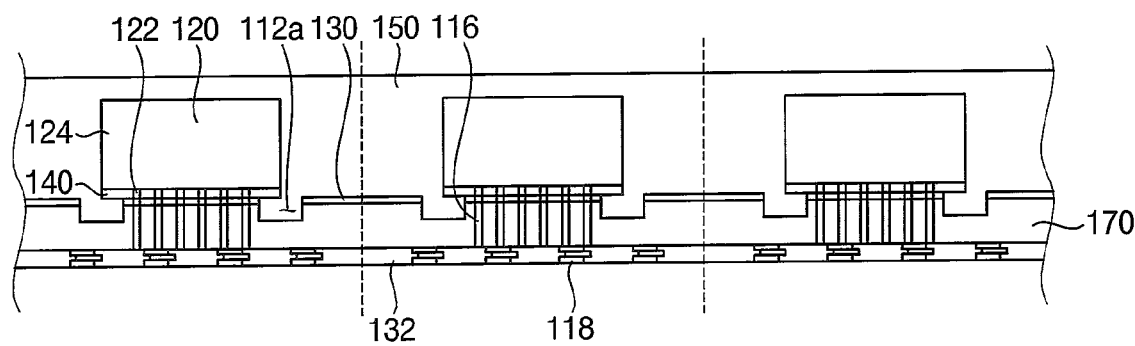

Referring to FIG. 14, the molding member 150 may be formed on the peripheral region P of the first semiconductor chip 110 to surround the second semiconductor chips 120 with the molding member 150.

Figure 15:
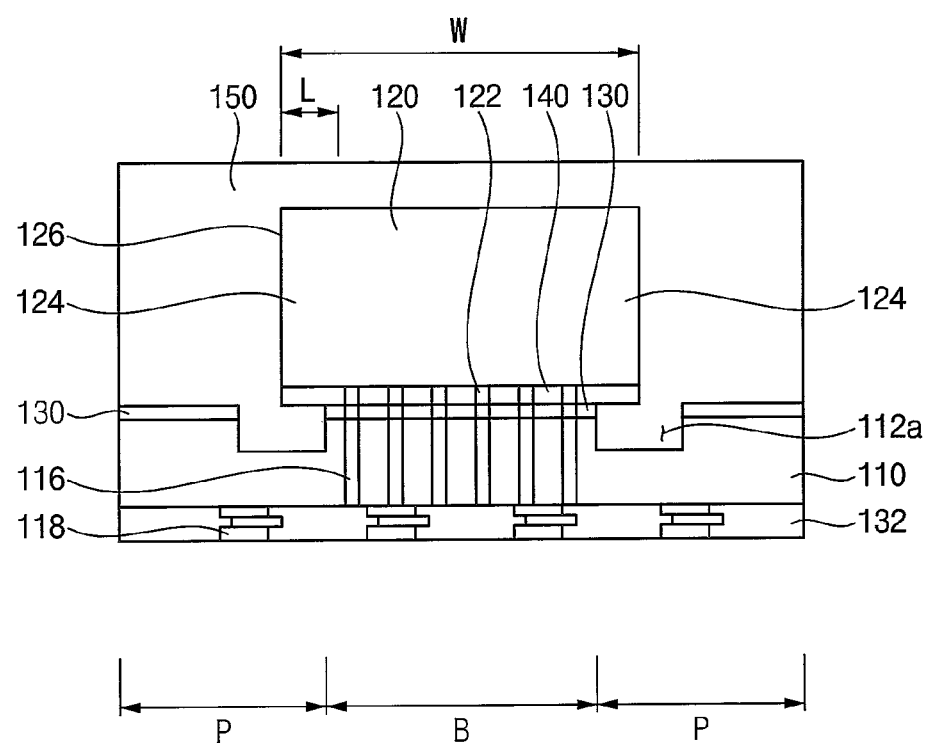

Referring to FIG. 15, the first semiconductor chip 110 and the molding member 150 may then be cut along the cut line set in the peripheral regions P. Alternatively, after cutting the first semiconductor chip 110, the molding member 150 may then be formed.

The conductive bumps 160 may be mounted on the lower surface of the first semiconductor chip 110 to complete the semiconductor package 100 in FIG. 9.

Figure 16:
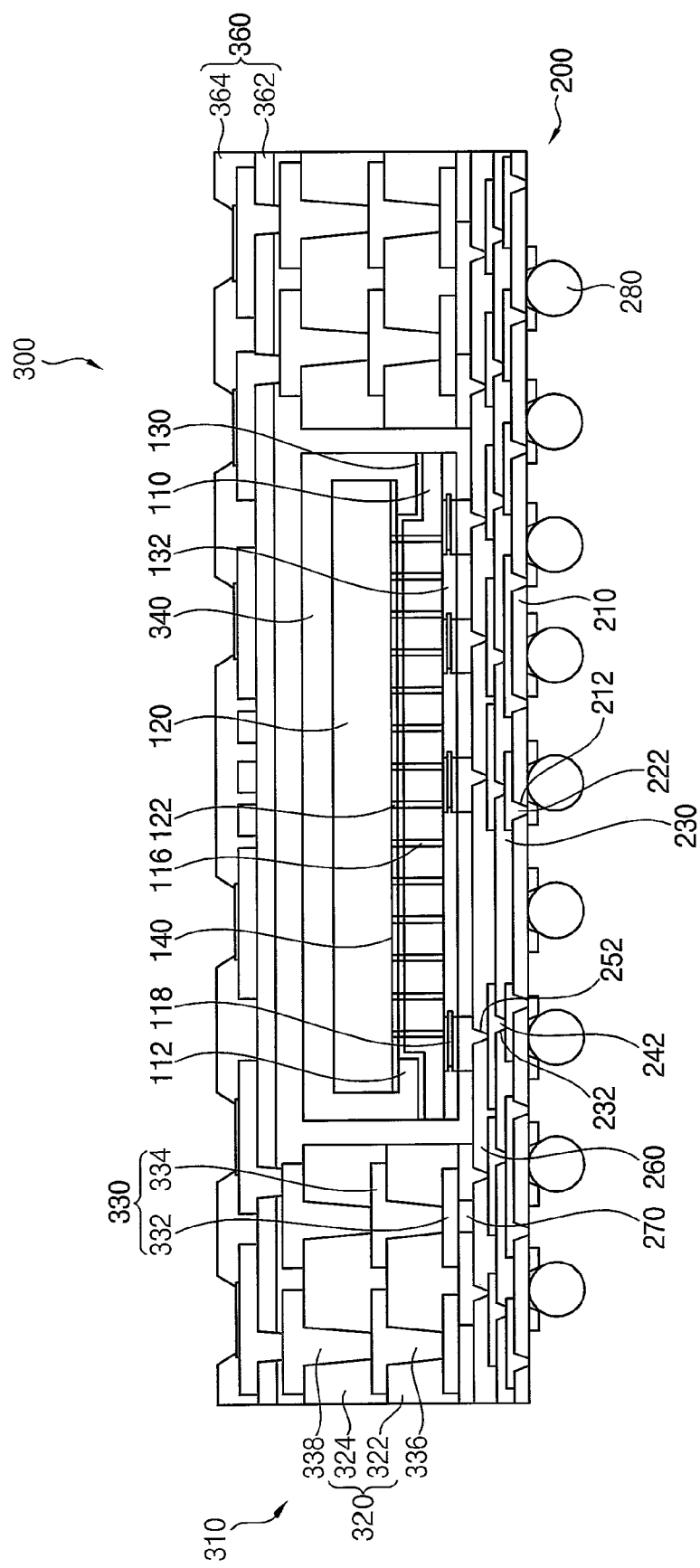
FIG. 16 is a cross-sectional view illustrating a semiconductor package in accordance with example embodiments of the present disclosure.

FIG. 16 is a cross-sectional view illustrating a semiconductor package in accordance with example embodiments of the present disclosure.

Referring to FIG. 16, a semiconductor package 300 of this example embodiment may correspond to a fan-out type semiconductor package. The semiconductor package 300 may include a lower redistribution (RDL) structure 200, a frame 310, a first semiconductor chip 110, a second semiconductor chip 120, a molding member 340, an upper RDL structure and external terminals 280.

The lower RDL structure 200 may include a first insulation layer 210, first RDLs 220, a second insulation layer 230, second RDLs 240, a third insulation layer 250, third RDLs 260 and a fourth insulation layer 270.

In example embodiments of the present disclosure, the first insulation layer 210, the second insulation layer 230, the third insulation layer 250 and the fourth insulation layer 270 may include photo imageable dielectrics (PID). Alternatively, the first insulation layer 210, the second insulation layer 230, the third insulation layer 250 and the fourth insulation layer 270 may include other insulation materials. Further, the first insulation layer 210, the second insulation layer 230, the third insulation layer 250 and the fourth insulation layer 270 may have substantially the same thickness as one another or they may have different thicknesses from one another.

The first RDLs 220, the second RDLs 240 and the third RDLs 260 may include metals such as copper, aluminum, etc., but the present invention is not necessarily restricted to these particular metals. Further, the first RDLs 220, the second RDLs 240 and the third RDLs 260 may have substantially the same thickness as one another or may different thicknesses from one another.

Alternatively, the lower RDL structure 200 may include stacked three or at least five insulation layers, and RDLs interposed between the insulation layers.

The first insulation layer 210 may include a plurality of first via holes 212. The first via holes 212 may be vertically formed through the first insulation layer 210. A lower solder resist pattern may be formed on a lower surface of the first insulation layer 210. The external terminals 280 may be mounted on the lower surface of the first insulation layer 210.

The first RDLs 220 may be disposed on an upper surface of the first insulation layer 210. The first RDLs 220 may include first via contacts 222 configured to fill the first via holes 212. The first via contacts 222 may be exposed through openings of the lower solder resist pattern. The external terminals 280 may be electrically connected to the exposed first via contacts 222.

The second insulation layer 230 may be disposed on an upper surface of the first insulation layer 210. The second insulation layer 230 may include a plurality of second via holes 232. The second via holes 232 may be vertically formed through the second insulation layer 230 to partially expose the first RDLs 220.

The second RDLs 240 may be disposed on an upper surface of the second insulation layer 230. The second RDLs 240 may include second via contacts 242 configured to fill the second via holes 232. Thus, the first RDLs 220 and the second RDLs 240 may be electrically connected to each other through the second via contacts 242.

The third insulation layer 250 may be disposed on an upper surface of the second insulation layer 230. The third insulation layer 250 may include a plurality of third via holes 235. The third via holes 252 may be vertically formed through the third insulation layer 250 to partially expose the second RDLs 240.

The third RDLs 260 may be disposed on an upper surface of the third insulation layer 250. The third RDLs 260 may include third via contacts 262 configured to fill the third via holes 252. Thus, the second RDLs 240 and the third RDLs 260 may be electrically connected to each other through the third via contacts 262.

The fourth insulation layer 270 may be disposed on an upper surface of the third insulation layer 250. The fourth insulation layer 270 may be configured to surround the third RDLs 260. Upper surfaces of the third RDLs 260 may be upwardly exposed by the fourth insulation layer 270.

The frame 310 may be disposed on the upper surface of the lower RDL structure 200. The frame 310 may include an insulation substrate 320 and a middle RDL 330. The insulation substrate 320 may include a cavity. The cavity may be formed through a central portion of the insulation substrate 320. The middle RDL 330 may be formed in the insulation substrate 320.

The insulation substrate 320 may include a first insulation layer 322 and a second insulation layer 324. The first insulation layer 322 may have an opening vertically formed therethrough. The second insulation layer 324 may be formed on an upper surface of the first insulation layer 322. The second insulation layer 324 may have an opening vertically formed therethrough.

The middle RDL 330 may include a first middle RDL pattern 332 and a second middle RDL pattern 334. The first middle RDL pattern 332 may be formed on a lower surface of the first insulation layer 322. The second middle RDL pattern 334 may be formed on the upper surface of the first insulation layer 322. The opening of the first insulation layer 322 may be filled with a first contact 336. Thus, the first middle RDL pattern 332 and the second middle RDL pattern 334 may be electrically connected to each other through the first contact 336. The opening of the second insulation layer 324 may be filled with a second contact 338. The second contact 338 may be electrically connected to the second middle RDL pattern 334. An upper surface of the second contact 338 may be upwardly exposed.

The first semiconductor chip 110 and the second semiconductor chip 120 may be disposed within the cavity of the insulation substrate 320. The first semiconductor chip 110 and the second semiconductor chip 120 may have a structure substantially the same as the structure in FIG. 1. Thus, to the extent that detailed description of certain elements has been omitted, it may be assumed that those elements are at least similar to corresponding elements that have been described elsewhere in the present disclosure and any further illustrations with respect to the first semiconductor chip 110 and the second semiconductor chip 120 may be omitted herein for brevity. For example, the second semiconductor chip 120 may have the overhang 124. Alternatively, the first semiconductor chip 110 and the second semiconductor chip 120 may have a structure substantially the same as the structure in FIG. 9.

The molding member 340 may be configured to mold the first semiconductor chip 110 and the second semiconductor chip 120. In example embodiments of the present disclosure, the molding member 340 may be formed on the upper surface of the insulation substrate 320 to fill spaces between the first and second semiconductor chips 110 and 120 and an inner surface of the cavity.

The upper RDL structure may include an upper insulation layer 360 and an upper RDL 370. The upper insulation layer 360 may be formed on an upper surface of the molding member 340. In example embodiments of the present disclosure, the upper insulation layer 360 may include PID. Alternatively, the upper insulation layer 360 may include other insulation materials.

The upper insulation layer 360 may include a first insulation layer 362 and a second insulation layer 364. The first insulation layer 362 may be formed on the upper surface of the molding member 340. The first insulation layer 362 may have an opening exposing the second middle RDL pattern 334.

The upper RDL 370 may be formed on an upper surface of the first insulation layer 362 to fill the opening. Thus, the upper RDL 370 may be electrically connected to the second middle RDL pattern 334.

The second insulation layer 364 may be formed on the upper surface of the first insulation layer 362. The second insulation layer 364 may have an opening exposing the upper RDL 370.

Additionally, an upper semiconductor chip may be disposed on an upper surface of the second insulation layer 364. Conductive bumps of the upper semiconductor chip may be disposed in the openings of the second insulation layer 364 to electrically connect the upper semiconductor chip with the upper RDL 370 via the conductive bumps.

Figure 17:
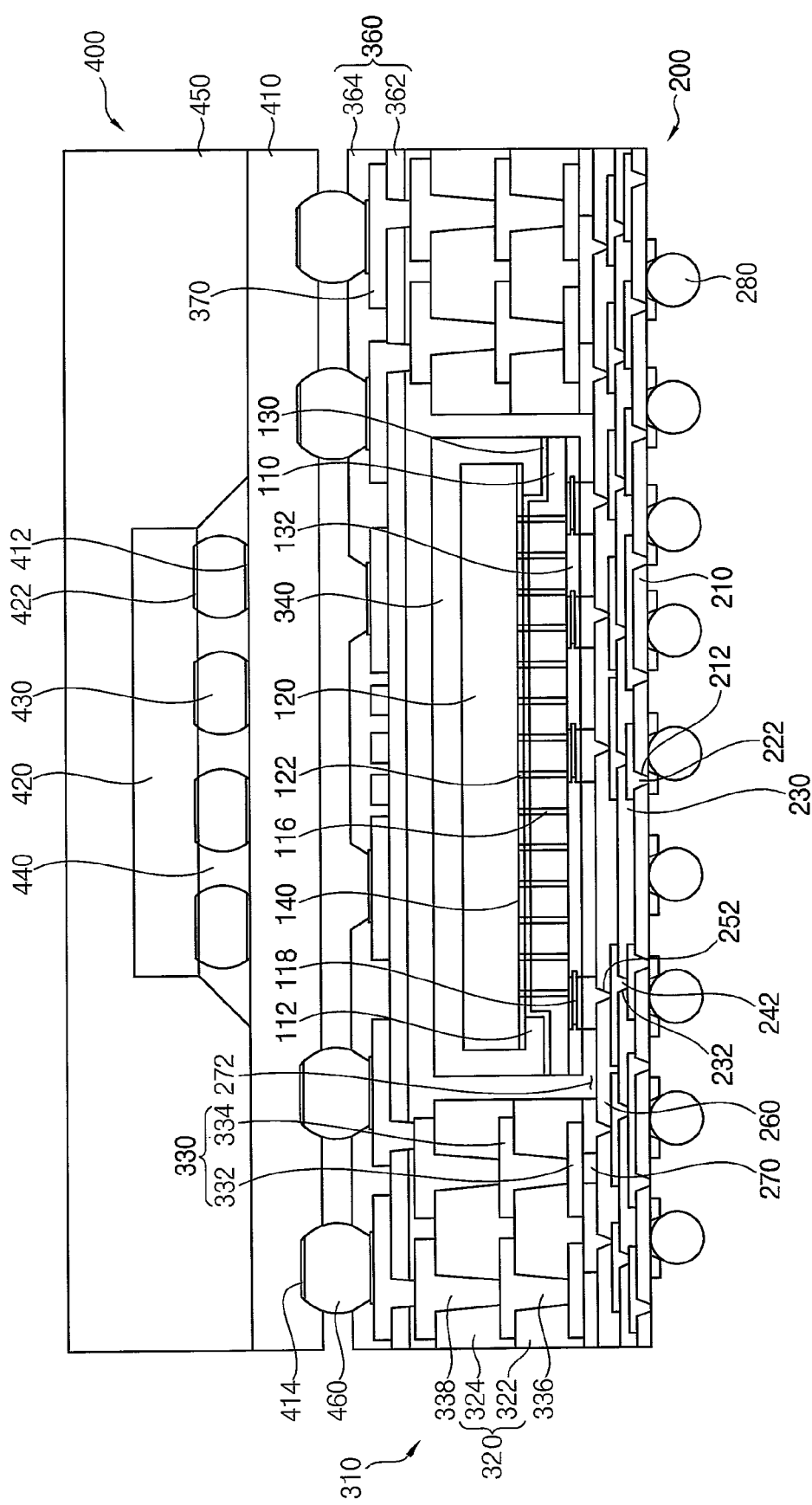
FIG. 17 is a cross-sectional view illustrating a semiconductor package in accordance with example embodiments of the present disclosure.

FIG. 17 is a cross-sectional view illustrating a semiconductor package in accordance with example embodiments of the present disclosure.

A semiconductor package 400 of this example embodiment may include elements substantially the same as those of the semiconductor package 300 in FIG. 16 except for further including a second semiconductor package. Thus, to the extent that detailed description of certain elements has been omitted, it may be assumed that those elements are at least similar to corresponding elements that have been described elsewhere in the present disclosure.

Referring to FIG. 17, the semiconductor package 400 may include the second semiconductor package stacked on the semiconductor package 300 in FIG. 16. For example, the semiconductor package 400 of this example embodiment may have a package-on-package (POP) structure.

The second semiconductor package may include a first semiconductor chip 410, a second semiconductor chip 420, conductive bumps 430, an underfilling layer 440 and a molding member 450.

The first semiconductor chip 410 may be electrically connected to the semiconductor package 300 in FIG. 16 via conductive bumps 460 such as solder balls. For example, the conductive bumps 460 may be mounted on the upper RDL 370 of the semiconductor package 300 in FIG. 16. A lower surface of the first semiconductor chip 410 may be electrically connected to the upper RDL 370 of the semiconductor package 300 via the conductive bumps 460.

The first semiconductor chips 410 may include a plurality of lower pads 414 and a plurality of upper pads 412. The lower pads 414 may be disposed on the lower surface of the first semiconductor chip 410. The lower pads 414 may electrically contact the conductive bumps 460. The upper pads 412 may be disposed on an upper surface of the first semiconductor chip 410.

The second semiconductor chip 420 may be disposed on an upper surface of the first semiconductor chip 410. The second semiconductor chip 420 may include a plurality of pads 422. The pads 422 may be disposed on a lower surface of the second semiconductor chip 420.

The conductive bumps 430 may be interposed between the first semiconductor chip 410 and the second semiconductor chip 420. For example, the conductive bumps 430 may be configured to electrically connect the upper pads 412 of the first semiconductor chip 410 with the pads 422 of the second semiconductor chip 420.

The underfilling layer 440 may be interposed between the first semiconductor chip 410 and the second semiconductor chip 420 to surround the conductive bumps 430. The underfilling layer 440 may include an insulation material such as an epoxy resin.

The molding member 450 may be formed on the upper surface of the first semiconductor chip 410 to cover the second semiconductor chip 420. The molding member 450 may include an EMC.

Figure 18:
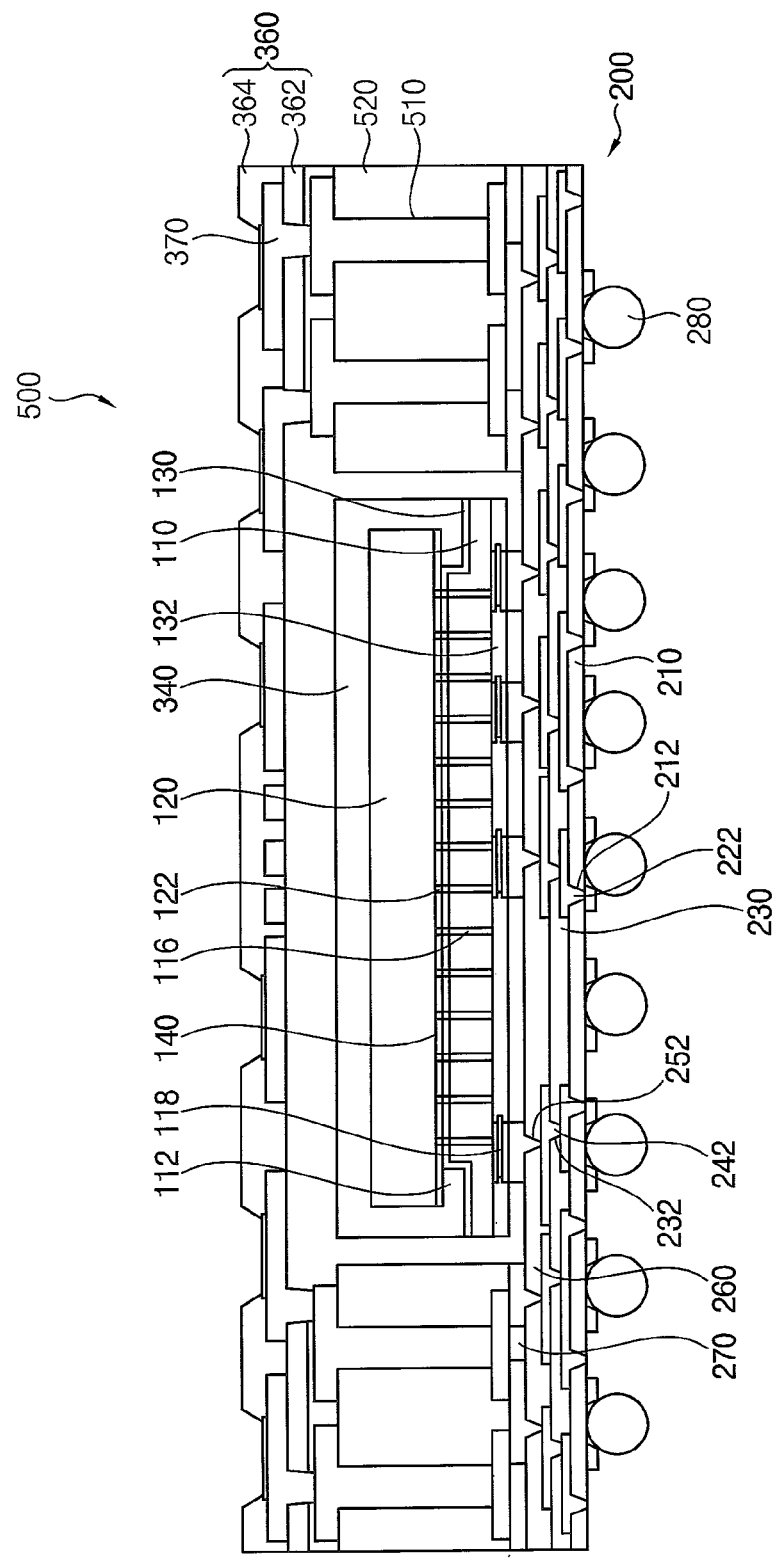
FIG. 18 is a cross-sectional view illustrating a semiconductor package in accordance with example embodiments of the present disclosure.

FIG. 18 is a cross-sectional view illustrating a semiconductor package in accordance with example embodiments of the present disclosure.

Referring to FIG. 18, a semiconductor package 500 of this example embodiment may correspond to a fan-out type wafer level package. Thus, the semiconductor package 500 of this example embodiment may include a lower RDL structure 200, a first semiconductor chip 110, a second semiconductor chip 120, a molding member 520, a connection via 510, an upper RDL, an upper insulation layer 360 and external terminals 380.

In example embodiments of the present disclosure, the lower RDL structure 200 may have a structure substantially the same as the structure of the lower RDL structure 200 in FIG. 16. Thus, to the extent that detailed description of certain elements has been omitted, it may be assumed that those elements are at least similar to corresponding elements that have been described elsewhere in the present disclosure and any further illustrations with respect to the lower RDL structure 200 may be omitted herein for brevity.

Further, the first semiconductor chip 110 and the second semiconductor chip 120 may have a structure substantially the same as the structure in FIG. 1. Thus, to the extent that detailed description of certain elements has been omitted, it may be assumed that those elements are at least similar to corresponding elements that have been described elsewhere in the present disclosure and any further illustrations with respect to the first semiconductor chip 110 and the second semiconductor chip 120 may be omitted herein for brevity. For example, the second semiconductor chip 120 may have the overhang 124. Alternatively, the first semiconductor chip 110 and the second semiconductor chip 120 may have a structure substantially the same as the structure in FIG. 9.

The molding member 520 may be formed on the upper surface of the lower RDL structure 200 to surround the side surfaces of the first and second semiconductor chips 110 and 120. The molding member 520 may be a part of the wafer.

The connection via 510 may be vertically formed through the molding member 520. A lower end of the connection via 510 may be electrically connected to the lower RDL structure 200. For example, the lower end of the connection via 510 may be electrically connected to the first RDL 220. The connection via 510 may include a metal such as copper.

The upper insulation layer 360 and the upper RDL 370 may have a structure substantially the same as the structure in FIG. 16. Thus, to the extent that detailed description of certain elements has been omitted, it may be assumed that those elements are at least similar to corresponding elements that have been described elsewhere in the present disclosure and any further illustrations with respect to the upper insulation layer 360 and the upper RDL 370 may be omitted herein for brevity. An upper end of the connection via 520 may be electrically connected to the upper RDL 370.

Figure 19:
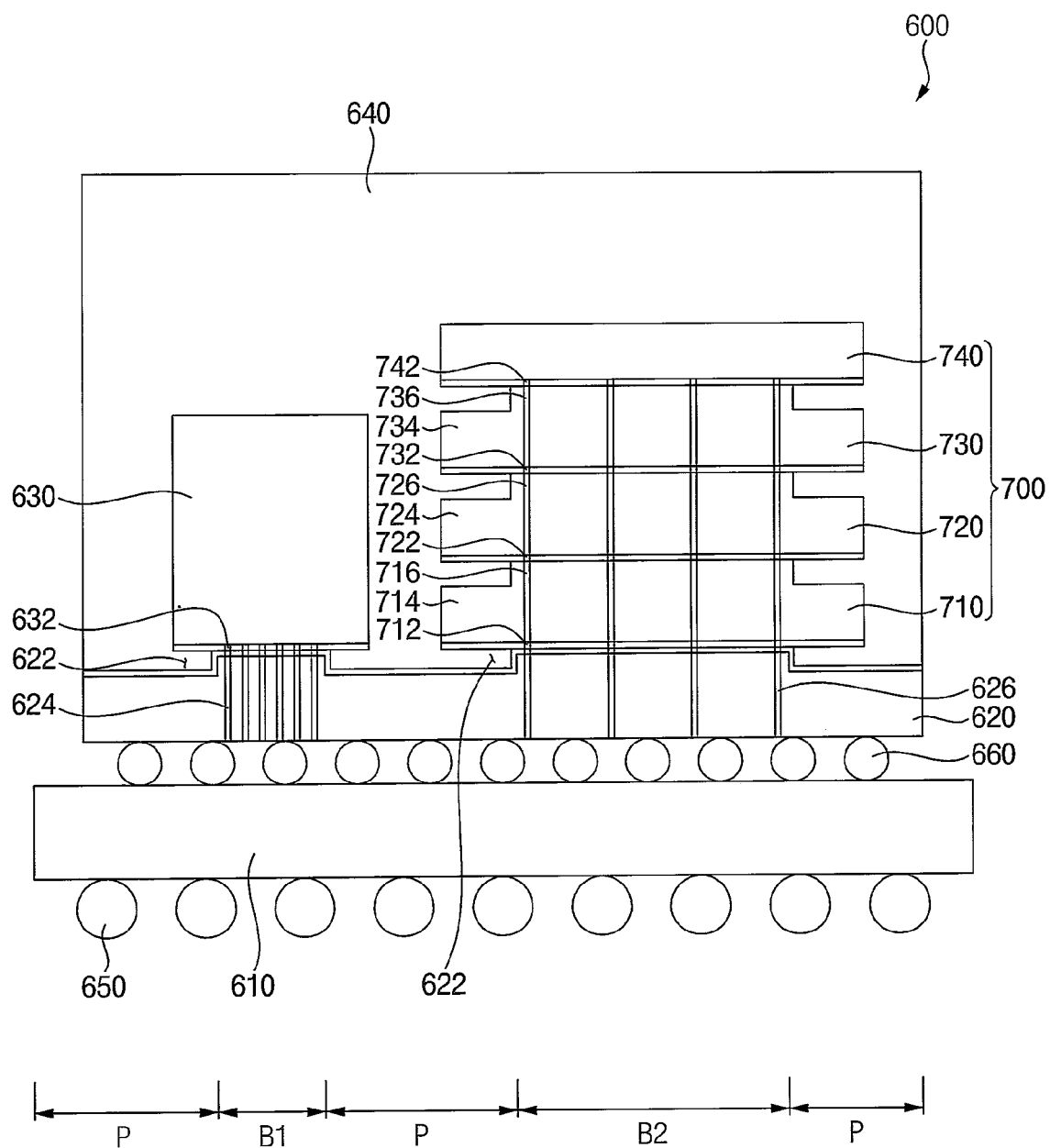
FIG. 19 is a cross-sectional view illustrating a semiconductor package in accordance with example embodiments of the present disclosure.

FIG. 19 is a cross-sectional view illustrating a semiconductor package in accordance with example embodiments of the present disclosure.

Referring to FIG. 19, a semiconductor package 600 of this example embodiment may include a three-dimensional (3D) stack type semiconductor package. Thus, the semiconductor package 600 may include a package substrate 610, a logic chip 620, at least one first semiconductor chip 630, a plurality of second semiconductor chips 700, a molding member 640 and external terminals 650.

The logic chip 620 may be disposed on an upper surface of the package substrate 610. The logic chip 620 may be electrically connected to the package substrate 610 via conductive bumps 660. The logic chip 620 may have a first bonding region B1, a second bonding region B2 and a peripheral region P. First connection vias 624 may be disposed in the first bonding region B1. Second connection vias 626 may be disposed in the second bonding region B2.

A groove 622 may be formed at the peripheral region P of the logic chip 620. Thus, the first and second bonding regions B1 and B2 may have an upper surface higher than an upper surface of the peripheral region P.

The first semiconductor chip 630 may be disposed on the upper surface of the first bonding region B1. The first semiconductor chip 630 may include bonding pads 632 disposed on a lower surface of the first semiconductor chip 630. The bonding pads 632 may be connected to the first connection vias 624 by a hybrid bonding process. The first semiconductor chip 630 may include an SRAM chip.

The first semiconductor chip 630 may have an area larger than an area of the first bonding region B1 of the logic chip 620. Thus, the first semiconductor chip 630 may include a first overhang 634 horizontally protruded from the first bonding region B1. The first overhang may be spaced apart from the peripheral region P of the logic chip 620.

The second semiconductor chips 700 may be stacked on the upper surface of the second bonding region B2. Each of the second semiconductor chips 700 may have an area larger than an area of the second bonding region B2 of the logic chip 620. Further, each of the second semiconductor chip 700 may have a bonding region and a peripheral region. The bonding region of the second semiconductor chip 700 may have an area substantially the same as the area of the second bonding region B2. The peripheral region of the second semiconductor chip 700 may be configured to surround the bonding region of the second semiconductor chip 700. Thus, at least one of the second semiconductor chips 700 may include a second overhang horizontally protruded from the second bonding region B2. The second overhang may be spaced apart from the peripheral region P. In example embodiments of the present disclosure, the second semiconductor chips 700 may include high bandwidth memory (HBM) chips.

In example embodiments of the present disclosure, the second semiconductor chips may include a 2-1 semiconductor chip 710, a 2-2 second semiconductor chip 720, a 2-3 semiconductor chip 730 and a 2-4 semiconductor chip 740 sequentially stacked.

The 2-1 semiconductor chip 710 may include 2-1 bonding pads 712 and 2-1 connection vias 716. The 2-1 bonding pads 712 may be disposed on a lower surface of the 2-1 semiconductor chip 710. The 2-1 connection vias 716 may be vertically extended through the 2-1 semiconductor chip 710 from the 2-1 bonding pads 712 to an upper surface of the 2-1 semiconductor chip 710. The 2-1 bonding pads 712 may be electrically connected to the second connection vias 626 of the logic chip 620 by a hybrid bonding process.

A groove may be formed at the peripheral region of the upper surface of the 2-1 semiconductor chip 710. Thus, the bonding region of the 2-1 semiconductor chip 710 may have an upper surface higher than an upper surface of the peripheral region. The 2-1 connection vias 716 may be disposed in the bonding region of the 2-1 semiconductor chip 710.

As mentioned above, because an area of the 2-1 semiconductor chip 710 may be larger than the area of the second bonding region B2 of the logic chip 620, the 2-1 semiconductor chip may include a 2-1 overhang 714 spaced apart from the peripheral region B of the logic chip 620.

The 2-2 semiconductor chip 720 may include 2-2 bonding pads 722 and 2-2 connection vias 726. The 2-2 bonding pads 722 may be disposed on a lower surface of the 2-2 semiconductor chip 720. The 2-2 connection vias 726 may be vertically extended through the 2-2 semiconductor chip 720 from the 2-2 bonding pads 722 to an upper surface of the 2-2 semiconductor chip 720. The 2-2 bonding pads 722 may be electrically connected to the 2-1 connection vias 716 of the 2-1 semiconductor chip 710 by a hybrid bonding process.

A groove may be formed at the peripheral region of the upper surface of the 2-2 semiconductor chip 720. Thus, the bonding region of the 2-2 semiconductor chip 720 may have an upper surface higher than an upper surface of the peripheral region. The 2-2 connection vias 726 may be disposed in the bonding region of the 2-2 semiconductor chip 720.

As mentioned above, because an area of the 2-2 semiconductor chip 720 may be larger than the area of the bonding region of the 2-1 semiconductor chip 710, the 2-2 semiconductor chip 720 may include a 2-2 overhang 724 spaced apart from the peripheral region of the 2-1 semiconductor chip 710.

The 2-3 semiconductor chip 730 may include 2-3 bonding pads 732 and 2-3 connection vias 736. The 2-3 bonding pads 732 may be disposed on a lower surface of the 2-3 semiconductor chip 730. The 2-3 connection vias 736 may be vertically extended through the 2-3 semiconductor chip 730 from the 2-3 bonding pads 732 to an upper surface of the 2-3 semiconductor chip 730. The 2-3 bonding pads 732 may be electrically connected to the 2-2 connection vias 726 of the 2-2 semiconductor chip 720 by a hybrid bonding process.

A groove may be formed at the peripheral region of the upper surface of the 2-3 semiconductor chip 730. Thus, the bonding region of the 2-3 semiconductor chip 730 may have an upper surface higher than an upper surface of the peripheral region. The 2-3 connection vias 736 may be disposed in the bonding region of the 2-3 semiconductor chip 730.

As mentioned above, because an area of the 2-3 semiconductor chip 730 may be larger than the area of the bonding region of the 2-2 semiconductor chip 720, the 2-3 semiconductor chip 730 may include a 2-3 overhang 734 spaced apart from the peripheral region of the 2-2 semiconductor chip 720.

The 2-4 semiconductor chip 740 may include 2-4 bonding pads 742. The 2-4 bonding pads 742 may be disposed on a lower surface of the 2-4 semiconductor chip 740. The 2-4 bonding pads 742 may be electrically connected to the 2-3 connection vias 736 of the 2-3 semiconductor chip 730 by a hybrid bonding process.

As mentioned above, because an area of the 2-4 semiconductor chip 740 may be larger than the area of the bonding region of the 2-3 semiconductor chip 730, the 2-4 semiconductor chip 740 may include a 2-4 overhang 744 spaced apart from the peripheral region of the 2-3 semiconductor chip 730.

The molding member 640 may be formed on the upper surface of the logic chip 620 to cover the first semiconductor chip 630 and the second semiconductor chips 700. The molding member 640 may include an EMC.

The external terminals 650 may be mounted on a lower surface of the package substrate 610. The external terminals 650 may include solder balls.

According to example embodiments of the present disclosure, the overhang may be formed at the edge portion of the second semiconductor chip by the groove at the peripheral region of the first semiconductor chip. The overhang may be spaced apart from the peripheral region of the first semiconductor chip. Thus, the edge portion of the second semiconductor chip with the overhang might not contact the first semiconductor chip. As a result, a bonding failure, which may be caused by particles generated in a cutting the wafer and adhered to the edge portion of the second semiconductor chip, between the first semiconductor chip and the second semiconductor chip might not be generated.

The foregoing is illustrative of example embodiments of the present disclosure and is not to be construed as limiting thereof. Although a few example embodiments of the present disclosure have been described, those skilled in the art will readily appreciate that many modifications are possible without materially departing from the novel teachings and aspects of the present invention. Accordingly, all such modifications are intended to be included within the scope of the present invention.

What is claimed is:

1. A semiconductor package, comprising:
   a first semiconductor chip including a plurality of connection vias and a wiring connected to lower ends of the plurality of connection vias;
   a second semiconductor chip disposed on a central portion of an upper surface of the first semiconductor chip, the second semiconductor chip including bonding pads configured to directly contact upper ends of the plurality of connection vias; and
   a molding member formed on the upper surface of the first semiconductor chip, the molding member at least partially surrounding the second semiconductor chip,
   wherein the plurality of connection vias are disposed on the central portion of the upper surface of the first semiconductor chip, and the central portion of the upper surface of the first semiconductor chip is at a higher level than an edge portion of the upper surface of the first semiconductor chip, relative to a package substrate, and
   wherein an edge portion of the second semiconductor chip is horizontally protruded from the central portion of the upper surface of the first semiconductor chip to form an overhang that is spaced apart from the edge portion of the upper surface of the first semiconductor chip, the overhang having a horizontal length of about 3/20 times to about 9/20 times a width of the second semiconductor chip, and a distance between a lower surface of the overhang and the edge portion of the upper surface of the first semiconductor chip is no less than about 8 μm.

2. The semiconductor package of claim 1, wherein the horizontal length of e overhang fs about 30 μm to about 90 μm.

3. The semiconductor package of claim 1, wherein the overhang has a rectangular frame shape extended along the edge portion of the second semiconductor chip.

4. The semiconductor package of claim 1, further comprising an upper insulation layer disposed on the upper surface of the first semiconductor chip, the upper insulation layer having openings exposing the upper ends of the connection vias.

5. The semiconductor package of claim 4, wherein the upper insulation layer is disposed on the central portion of the upper surface of the first semiconductor chip.

6. The semiconductor package of claim 5, wherein the upper insulation layer is disposed on the edge portion of the upper surface of the first semiconductor chip.

7. The semiconductor package of claim 1, wherein the molding member fills a space between the overhang and the edge portion of the upper surface of the first semiconductor chip.

8. The semiconductor package of claim 1, further comprising conductive bumps mounted on the wiring.

9. A semiconductor package, comprising:
   a first semiconductor chip including a peripheral region having a groove and a bonding region that is at a higher level than the peripheral region, with respect to a package substrate; and
   a second semiconductor chip disposed on the banding region of the first semiconductor chip and electrically connected to the first semiconductor chip, the second semiconductor chip including an overhang protruded from the bonding region and spaced apart from a bottom surface of the groove,
   wherein the overhang protrudes from the bonding region and comes to an end overlapping the groove in a vertical direction, with respect to the package substrate, which extends horizontally.

10. The semiconductor package of claim 9, wherein the groove has a width that is substantially the same as a width of the peripheral region.

11. The semiconductor package of claim 9, wherein the groove has a width that is narrower than a width of the peripheral region.

12. The semiconductor package of claim 11, wherein the groove is extended from a side surface of the bonding region.

13. The semiconductor package of claim 9, wherein the first semiconductor chip comprises
   a plurality of connection vias vertically disposed in the first semiconductor chip and directly connected to the second semiconductor chip;
   an upper insulation layer disposed on the upper surface of the first semiconductor chip and exposing upper ends of the plurality of connection vias;
   a wiring connected to lower ends of the plurality of connection vias; and
   a lower insulation layer disposed on a lower surface of the first semiconductor chip exposing the wiring.

14. The semiconductor package of claim 13, wherein the second semiconductor chip comprises a plurality of bonding pads disposed on a lower surface of the second semiconductor chip and directly connected to the upper ends of the plurality of connection vias.

15. The semiconductor package of claim 9, wherein the bonding region is a central portion of the upper surface of the first semiconductor chip, and the peripheral region at least partially surrounds the bonding region.

16. The semiconductor package of claim 9, wherein the overhang is horizontally protruded from the bonding region.

17. The semiconductor package of claim 16, wherein the overhang has a horizontal length of about 3/20 times to about 9/20 times a width of the second semiconductor chip.

18. The semiconductor package of claim 16, wherein a distance between a lower surface of the overhang and a bottom surface of the groove is no less than about 8 μm.

19. The semiconductor package of claim 16, wherein the overhang has a rectangular frame shape at least partially surrounding four side surfaces of the second semiconductor chip.

20. The semiconductor package of claim 19, wherein the upper insulation layer is disposed on an upper surface of the bonding region in the first semiconductor chip.

* * * * *